United States Patent [19]

Koller et al.

[11] Patent Number: 5,442,848
[45] Date of Patent: Aug. 22, 1995

[54] WIRE POSITIONING AND CUT-OFF TOOL

[75] Inventors: Stefan Koller, Niederstotzingen; Bernhard Albeck, Lorch-Waldhausen, both of Germany

[73] Assignee: Vossloh-Schwabe GmbH, Urbach, Germany

[21] Appl. No.: 217,235

[22] Filed: Mar. 24, 1994

[51] Int. Cl.⁶ .................... H01R 43/00; B21F 27/00
[52] U.S. Cl. .................... 29/566.1; 29/56.6; 29/566.3; 140/93 R
[58] Field of Search .............. 29/564.2, 564.4, 564.6, 29/755, 56.6, 566.1, 566.3, 564.7, 33 F, 564.8; 140/93 R

[56] References Cited

U.S. PATENT DOCUMENTS

| | | | |
|---|---|---|---|
| 3,693,228 | 9/1972 | Cogan | 29/56.6 |
| 3,930,524 | 1/1976 | Tarbox | 140/93 R |
| 3,939,541 | 2/1976 | Magherini | 29/564.4 |
| 4,031,612 | 6/1977 | Nicolas | 29/564.4 X |
| 4,400,874 | 8/1983 | Craver | 29/755 X |
| 4,499,648 | 2/1985 | Brown et al. | 29/564.2 |

FOREIGN PATENT DOCUMENTS

| | | |
|---|---|---|
| 1290210 | 3/1969 | Germany . |
| 3606059C2 | 8/1987 | Germany . |
| 3611805A1 | 10/1987 | Germany . |
| 3812171A1 | 11/1988 | Germany . |
| 3820636A1 | 12/1989 | Germany . |

Primary Examiner—William Briggs
Attorney, Agent, or Firm—Frishauf, Holtz, Goodman & Woodward

[57] ABSTRACT

To permit close positioning of a wire positioning finger (2) adjacent a slit blade insulation piercing connector, a pressing element (19) having a pressure surface (22) is movably located adjacent a wire outlet opening (10) of a wire guide duct (4) in the positioning finger. The pressing element (19) is movable, preferably longitudinally slidable on the finger, for movement transverse to the axis of the wire outlet opening between a quiescent position removed from the wire opening and a holding position to hold the wire (5) preparatory to cutting it off. A cutting knife (12) is movably located on the positioning finger (2), preferably slidable longitudinally, in the vicinity of the wire outlet opening (10) and movable between a rest position and cutting position in front of the wire opening. Respective pressing element control units (21) and knife operating control units (13) are provided, coupled to the pressing element (19) and to the knife (12) for programmed movement of the respective elements. Preferably, the pressing element (19) has a projecting portion (25) to counteract the tendency of a wire to curl as it leaves the wire outlet opening (10) from the positioning finger (2). The counter surface for the knife is formed by a wall (43) of the guide duct in the finger.

20 Claims, 3 Drawing Sheets

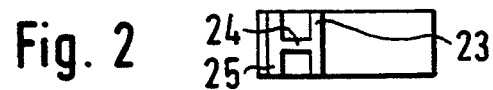
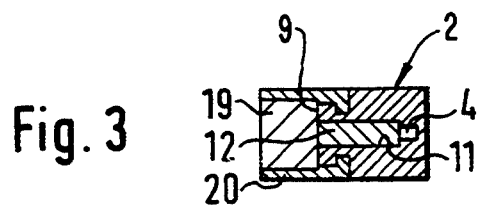
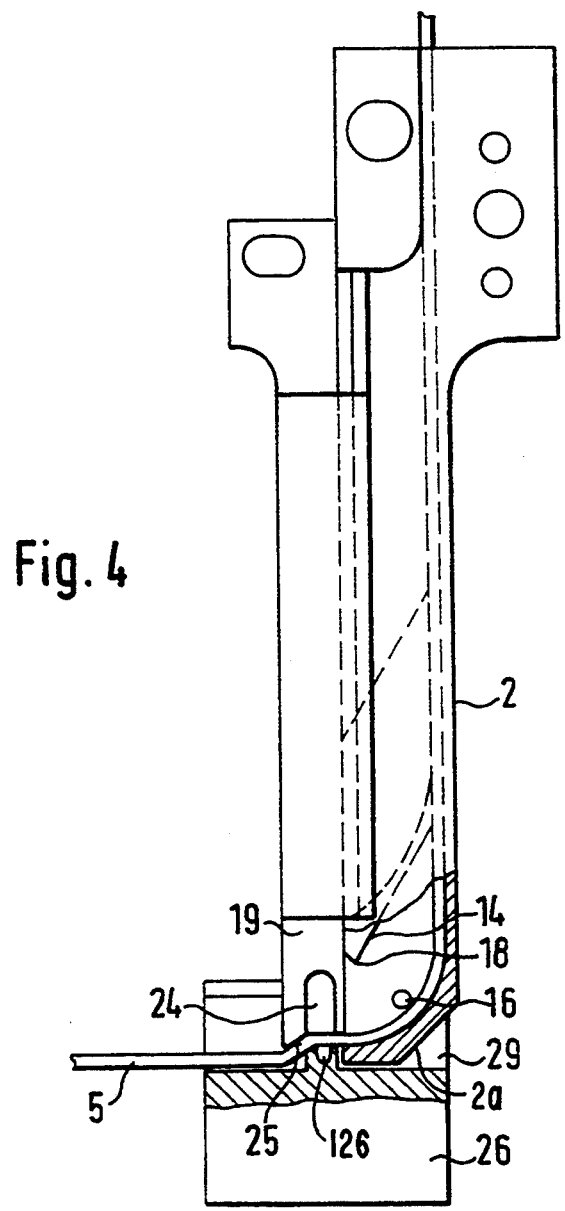

WIRE POSITIONING AND CUT-OFF TOOL

Reference to related applications, the disclosures of which are hereby incorporated by reference, assigned to the assignee of the present application:

U.S. Ser. No. 08/230,063, filed Apr. 20, 1994, MEWS et al (claiming priority German Appln. P 43 12 776.2 of Apr. 20, 1993; attorney docket 940034-shf; PA 42 US sg);

U.S. Ser. No. 08/226,029, filed Apr. 11, 1994, MEWS et al (claiming priority German Appln. P 43 12 780.0 of Apr. 20, 1993; attorney docket 940035-shf; PA 40 US sg);

U.S. Ser. No. 08/190,129, filed Feb. 3, 1994, AL-BECK et al PCT/DE93/00456, U.S. designated (attorney docket 930925-shf; PA 45 PCT US sg).

Reference to related disclosures:
DE-OS 36 06 059
DE-OS 36 11 805
DE-OS 38 20 636.

FIELD OF THE INVENTION

The present invention relates to a tool to place a wire and, when placed, cut it off, which tool is specifically adapted to cut off the wire close to a terminal, and especially a solderless slit blade insulation piercing connector in which the tool can be coupled to an automatic wire placement apparatus, for example a wire placement robot.

BACKGROUND

Wire placement tools for positioning electrical wires usually have a housing from which a positioning finger extends. The positioning finger has a guide duct for a wire and, further, is coupled to or formed with wire feed apparatus and cut-off apparatus for the wire, when cutting is desired. Wire placement tools of such type are well known, see for example the referenced German Patent Disclosure Documents DE-OS 36 06 059, DE-OS 36 11 805 and DE-OS 38 20 636. Such wire placement tools are used, for example, to make wire harnesses, wire bundles, or the like. They are also used, however, to wire machine components, fixtures and the like. The wire positioning finger is brought to a particular position such that the terminal end of the guide duct is located adjacent a terminal position, in which the wire which exits from the guide duct is to be positioned and terminated. The cut-off of the wire is usually effected by a separate cut-off module of the tool, which is coupled to the positioning finger, for example in advance thereof, and usually located some distance in advance of the end of the positioning finger. Such tools make it difficult to cut off the wire immediately adjacent the terminal to which it is to be connected, and frequently make it impossible.

THE INVENTION

It is an object to provide a wire positioning tool which is simple and particularly suited to connect insulated wires to slit blade insulation piercing connectors, that is, to place the wire into such a connector and after placement sever the wire close to the connector; or at the side which was not cut, to then place the wire where desired, for example as controlled by an automatic or robot-positioning system.

Briefly, the tool housing, or an accessory, has a wire feeding arrangement to feed wire through a positioning finger which extends from the housing. The wire is guided in the finger within a channel or duct to a wire outlet opening. A pressing element having a pressure surface is movably located adjacent the wire outlet of the finger, for movement transversely to the axial direction of the outlet opening. Position control means are coupled to the pressing element for selectively positioning the pressing element in a quiescent position, removed from the wire outlet opening on the finger, and a holding position to position the wire for cutting of the wire projecting from the wire outlet opening. The pressure surface extends at least up to the wire opening when the pressing or punch element is in a cutting position. A cutting knife is movably located on the positioning finger in the vicinity of the wire outlet from the finger and movable between a rest and a cutting position in front of the wire opening. Knife operating means are provided to move the cutting knife between rest and cutting position.

The pressing element permits pressing the wire which exits from the guide channel of the positioning finger directly into the insulation piercing slit of the slit blade insulation piercing connector, when the finger is suitably positioned, for example automatically, or as commanded by a control program. The cut-off elements for the wire which are located in the vicinity of the exit opening from the guide channel then cut the wire close to the connector, leaving only a very short stub of the wire projecting from the connector, which small end can readily be received within suitable portions of a positioning element for the slit blade insulation piercing connector, and not requiring additional insulation to be applied thereover.

DRAWINGS

FIG. 2 is an end view of the positioning finger of the positioning tool, looked at from below;

FIG. 3 is a sectional view of the positioning finger of FIG. 1 taken along section line III—III of FIG. 1;

FIG. 4 is a view of the finger only, similar to FIG. 1, and illustrating the position as the wire is being pressed into a slit blade insulation piercing connector.

DETAILED DESCRIPTION

Figures 1, 1A:
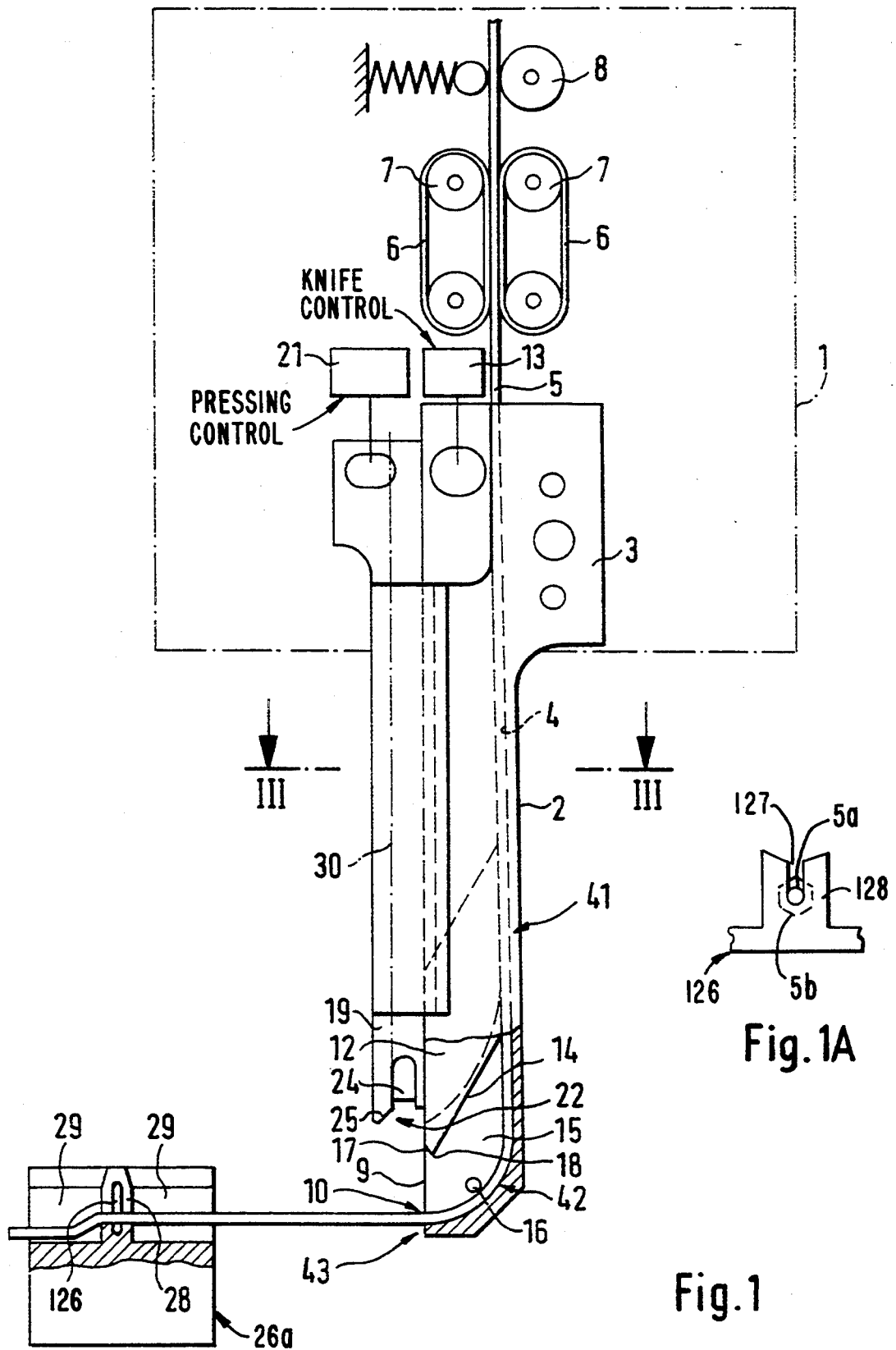
FIG. 1 is a highly schematic side view of a positioning system for a wire, partly in section, and illustrating the positioning finger after it has left a terminal where a wire was placed.
FIG. 1A is a fragmentary front view of a slit blade insulation piercing connector for which the tool of FIG. 1 is particularly suitable as a wire insertion tool.
Figure 5:
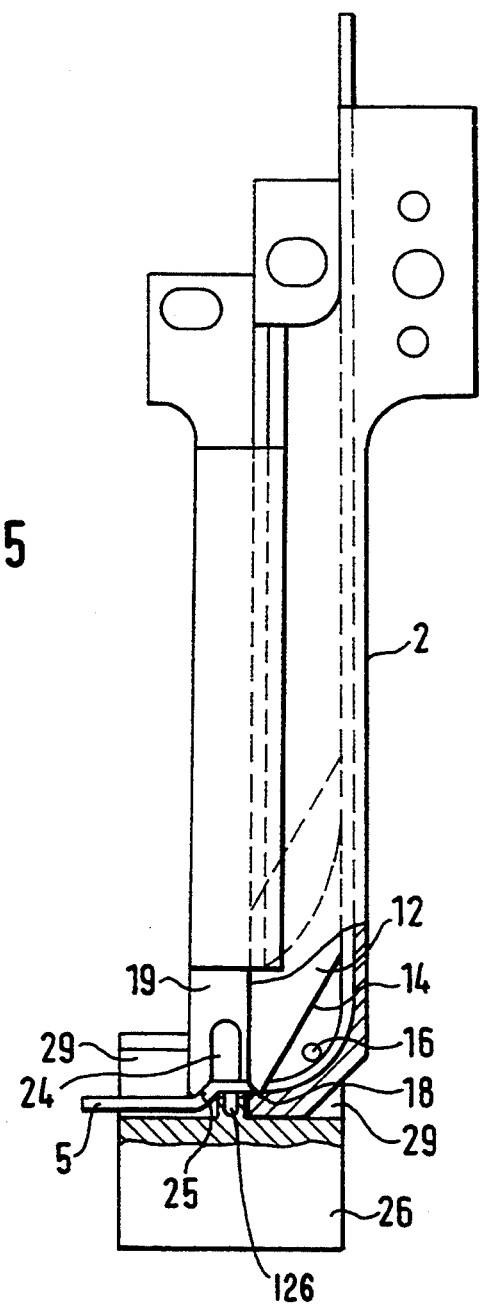
FIG. 5 is a view similar to FIG. 4, and illustrating the apparatus as the wire is being cut.

Referring first to FIG. 1, which illustrates the wire positioning system, in highly schematic fragmentary form, and the wire positioning finger, after the wire has been placed in a terminal 26a and is to be guided to a further terminal 26, where it is to be terminated and cut. The further terminal is not shown in FIG. 1 but is shown in FIGS. 4 and 5.

As best seen in FIG. 1, the tool has a housing 1 which can be secured to a wire positioning robot or numerically controlled positioning system, not shown, and of any suitable construction. The housing 1 has a projecting wire positioning finger 2, which extends downwardly from a working position of the housing. The wire positioning finger 2 has essentially rectangular cross section—see FIG. 3. Usually it is made of steel.

The finger 2 is secured to the housing 1 in a suitable manner, as schematically shown by an attachment flange 3. The wire finger 2 has a guide channel or duct 4 for an insulated wire 5, which is being supplied from a supply spool, not shown. The housing 1 retains a feed structure for the wire 5 formed, for example, by a pair of program-controlled feed rollers 7 over which straightening and feed belts 6 are looped. A clamping system 8 positions the wire in alignment with the feed system 6, 7 and ensures positioning, holding and directing the wire in the housing 1.

The guide duct 4, see FIG. 3, is generally L-shaped. It has a vertical portion 41 (FIG. 1) which then extends about a curved portion 42 to an essentially horizontal portion 43. The curved portion 42 is bent about 90°, preferably in circular bent form. The portion 43 is short and terminates in a wire exit or outlet mouth or opening 10 formed on the finger 2, through which the wire 5 can exit from the finger. The finger 2 has a groove 11 (FIG. 3) with parallel flanks. A knife blade 12, of essentially rectangular cross section, is longitudinally guided in the groove 11. The knife blade 12 is coupled to a program controlled positioning element 13. It terminates at the bottom end in an inclined cutting edge 14. The cutting edge 14, which extends over the largest portion of the width of the blade 12, is located in a slit-like recess 15 of the positioning finger 2 above the opening 10 of the duct 4. A pin 16 additionally provides for guidance of the wire 5 in the opening or recess 15 of the finger. The cutting edge 14, together with a short cut-off edge 17, with which it forms an acute angle, defines a cutting tip or end edge 18 which is positioned in the immediate vicinity of the opening 10 of the guide duct 4 within the recess or opening 15.

The knife blade 12 is located above the curved portion 42 and the following straight portion of the guide channel 4. The tip or end edge 18 of the knife cooperates with the lower wall of the horizontal wire guide channel portion 43, the lower wall forming a counter surface or anvil for the cutting tip or end edge 18. A pressing element 19, in form of a punch or hold-down blade, is slidable in a slide groove 20, see FIG. 3, for longitudinal sliding movement along the finger 2. A program-controlled operating unit 21 controls movement of the pressing element 19 to move it vertically up and down on a forward end surface 9 on the finger 2.

The pressing element is formed with a pressure surface 22 (FIG. 1) at its end face, which extends over a large portion in a horizontal plane, and is intended to engage a wire 5 emitted from the exit opening 10 of the finger 2. As best seen in FIG. 2, a pressure surface portion 23 adjoins the vertical guide surface of the finger 2. The surface 23 is generally rectangular and has essentially the same width as the finger 2. A narrow rectangular rib 24 is joined in the center to the pressure surface 23, followed by a downwardly projecting nose portion 25, which extends at an inclination, as best seen in FIG. 1 and which, again, has generally the width of the finger 2.

The curved portion 42, and inherent elasticity of the wire 5, would cause the wire 5 to roll upwardly, similar to a spring. The inclined nose 25 has the function to prevent this upward-rolling tendency of the wire 5 when the wire is to be engaged with a terminal, and is positioned adjacent a slit blade insulation piercing connector.

Use and Operation, with Reference to FIGS. 1, 4 and 5

FIG. 1 illustrates the operating condition in which the wire 5, exiting from the opening 10 of the finger 2, was connected to a terminal 26a at a connection point in a prior operation. The terminal 26a (FIG. 1) was contacted in a prior operating step by the wire 5. The terminal element itself is a slit blade insulation piercing connector 126 which is shown in plan view in FIG. 1a. The terminal 26, with the wire inserted, is seen in end view in FIG. 1A. It has a blade element 128, with a longitudinal slit 127. FIG. 1A illustrates the conductor 5a of the wire 5 inserted and clamped in the slit 127, with the insulation 5b of the wire engaging against the slit blade insulation piercing connector 126. Two such blade elements 128, separated by slit 127, can provide resilient, springy connecting elements secured to a base 29, as shown in FIG. 1.

A groove-like recess or depression 29 is formed on either side of the connector 126. Ribs 28, extending from the base 29, hold the connector in position.

The finger 2 can now be moved to a second connecting position to connect and terminate the wire 5 in a second subsequent slit blade insulation piercing connector 26, as illustrated in FIG. 4.

Before moving the finger 2, the pressing element 19 is raised in the position shown in FIG. 1 in order to permit the finger 19 to leave the right portion of the recess or depression 29 of the prior connector 26a. As soon as the finger 2 is free from the connector 26a, and has reached the desired connector 26 (FIG. 4), element 19 is moved downwardly in a position in which the surface 25 engages the wire 5 leaving the mouth opening 10 from the finger 2; this can compensate for the tendency of the wire to roll upwardly. Only the bottom of the connector 126 itself is visible in FIG. 4, since the remainder is behind the pressing element 19.

The finger 2, with the pressing element 19 in the position shown in FIG. 4, is thus positioned above the further connecting terminal 26, such that it is above the groove-like recess or depression 29. Finger 2 and the pressing element 19 are lowered. The finger 2 and the pressing element 19 engage in the groove-like recess or depression 19 of the terminal 26, such that the wire exiting from the opening 10 of the finger 2 is inserted, pressed and clamped in the insulation-piercing connector slit 127 of the connector blade 128.

In this condition, the wire 5 is supported on both sides of the slit 127 by the region 23 (FIG. 2) of the pressing element 19, as well as by the nose portion 25 thereof. The conductor within the insulated wire 5 is supported by the face of the rib 24 (FIG. 2). The rib 24 has a width tranverse to the longitudinal direction of the wire which is preferably less, or at the most very slightly larger, most preferably not more than equal to the diameter of the conductor within an insulation sleeve or a coating of the wire 5. The nose 25 presses the wire 5 to the bottom of the associated groove or recess 29.

Although not strictly necessary, in some apparatus units the pressing element 19 can be formed in two separate structures, permitting independent movement of the nose portion with the surface 25 and of the conductor engagement portion 24 and the rear portion 23 (FIG. 2). Such a two-part pressing element is schematically indicated by the chain-dotted line 30, in FIG. 1, controlled by a separate pressing control unit, similar to unit 21.

The wire is cut by moving the cutter blade 12 into the cutting position, shown in FIG. 5. It is cut after the wire has been inserted and pressed into the slit of the slit blade insulation piercing connector 126. As seen in FIG. 5, the finger knife control unit 13 (FIG. 1) moves the blade 12 downwardly, so that the blade tip or end edge 18, in combination with the lower wall of the horizontal portion 43 of the guide duct 4, cuts the wire 5 closely adjacent the slit blade insulation piercing connector 126.

In some terminal installations it can be desirable to slightly move the horizontal portion 43 of the finger downwardly by a small distance, so that the terminal portion of the wire will receive, also on this side of the connector 126, a slightly downwardly oriented bend, so that the cut end of the wire 5 will be bent downwardly. Thus, the same effect as that obtained by the nose 25 can be achieved also at the cut end of the wire by cooperation of the blade element 12 with the lower portion 43 of the finger.

After cutting the wire, the finger 2 is raised, the pressing element 19 and the blade 12 revert to their respective quiescent and rest positions, and further wire laying by the finger 2 can be effected.

The finger 2 is chamfered at its lower end in the region of the guide pin 16 at the back side thereof, as seen in FIG. 1, at the surface 2a. The rear surface 2a as well as the forward surface can be inclined or rounded or wedge-shaped. Inclined end portions of the finger have the advantage that when the finger passes by holding elements for conductors which are elastically deflectable, such holding elements can automatically snap back even if the finger 2 has impinged thereagainst upon placing the wire 5.

Various changes and modifications may be made. Moving the finger, raising the knife blade, the pressing control, and timing, can all be controlled automatically, in accordance with suitable programs; such programs can, for example, position the finger in selected coordinate points with respect to a workpiece and, when placed at certain locations, then sequentially automatically control movement of, respectively, the pressing control 21, a separate control for the tip 25 of the portion 19, if provided, and the knife control 13.

The tool is also useful for inserting a continuous wire into a connector 126, as seen at 26 in FIG. 1, by omitting the cutting operation.

Various changes and modifications may be made within the scope of the inventive concept.

We claim:

1. Compact combined wire positioning and cut-off tool for, in one operation, positioning a wire (5) and cutting the wire closely adjacent said tool, comprising
   a tool housing (1);
   a positioning finger (2) extending from the housing;
   a wire guide channel or duct (4) formed in the finger and having a wire outlet opening (10);
   a pressing element (19) having a pressure surface (22) movably located adjacent the wire outlet opening (10) for movement transversely to the axial direction of the outlet opening;
   pressing element position control means (21) coupled to the pressing element (19) for positioning the pressing element in a quiescent position removed from the wire outlet opening (10), and a holding position for holding the wire projecting from the wire outlet opening (10), the pressure surface (22) extending at least up to the wire outlet opening when the pressing element (19) is in the holding position;
   cutting means (12) movably located on the positioning finger (2) in the vicinity of the wire outlet opening (10) and movable between a rest position clear of the wire opening and a cutting position in front of the wire outlet opening; and
   wherein said pressure surface (22) of said pressing element (19) has a rib (24) essentially aligned with the wire (5) projecting from the outlet opening (10), and having a width transverse to the direction of said wire projecting from the outlet opening which has a dimension approximately up to the diameter of a conductor (5a) within the wire (5).

2. The tool of claim 1, wherein the cutting means comprises a blade element terminating in an end portion (18); and
   wherein the positioning finger, in the vicinity of said outlet opening (10), is formed with a knife surface (43) for cutting cooperation with said end portion.

3. The tool of claim 1, wherein said pressure surface (22) is formed with at least one region (23, 25) wider than said rib (24).

4. The tool of claim 1, wherein said pressure surface (22) is formed on at least one side of the rib (24) and has the shape of a projecting nose (25).

5. The tool of claim 3, wherein the at least one region (23, 25) of wider width has essentially the same width as the width of the positioning finger (2).

6. The tool of claim 1, wherein said rib (24) has a central region extending in longitudinal direction with respect to the wire (5) projecting from the outlet opening (10), said central region having the width of substantially up to the diameter of the conductor (5a) within said wire (5);
   and two regions of wider width (23, 25), located at end regions of said rib (24), one of said regions being located adjacent an end surface (9) of the finger (2) and adjacent said wire outlet opening (10).

7. The tool of claim 1, wherein
   said positioning finger (2) has an angled-off portion (43), said wire outlet opening (10) being located at a terminal surface of said angled-off portion, and said cutting means is movably located for movement across said wire outlet opening (10).

8. The tool of claim 7, wherein said cutting means comprises a knife having a blade element formed with an edge (14) extending at an inclination with respect to a guide wall of said wire guide channel (4).

9. The tool of claim 8, wherein said blade element (12) terminates in a cutting tip or end edge (18).

10. The tool of claim 9, wherein said cutting tip or end edge (18), when said blade element is in a cutting position, is located in the vicinity of the wire outlet opening (10).

11. The tool of claim 9, wherein the pressing element (19) is longitudinally slidably on the positioning finger (2).

12. The tool of claim 1, wherein the cutting means comprises a knife having a blade element (12) which is longitudinally slidable along the positioning finger (2).

13. The tool of claim 12, wherein the pressing element (19) is longitudinally slidable on the positioning finger; and
   the cutting blade element (12) and the pressing element (19) are located adjacent each other on the positioning finger (2).

14. The tool of claim 1, wherein said pressing element comprises a two-component structure, one component (30) carrying a hold-down pressure surface (25) and the other component carrying a holding surface (22) projecting, when in holding position, by a lesser extent than said hold-down pressure surface (25).

15. The tool of claim 1, wherein the cutting means comprises a blade element (12) terminating in an end edge (18); and
   wherein the positioning finger (2), in the vicinity of said wire outlet opening (10), is formed with a cutting counter surface or anvil (43) for the cutting end edge (18).

16. The tool of claim 1, wherein said cutting means comprises a knife means (12); and
   knife operating means (13) coupled to the cutting knife means (12) for moving the cutting knife means between said positions.

17. Compact combined wire positioning and cut-off tool for, in one operation, positioning a wire (5) and cutting the wire closely adjacent said tool, comprising
   a tool housing (1);
   a positioning finger (2) extending from the housing;
   a wire guide channel or duct (4) formed in the finger and having a wire outlet opening (10);
   a pressing element (19) having a pressure surface (22) movably located adjacent the wire outlet opening (10) for movement transversely to the axial direction of the outlet opening;
   pressing element position control means (21) coupled to the pressing element (19) for positioning the pressing element in a quiescent position removed from the wire outlet opening (10), and a holding position for holding the wire projecting from the wire outlet opening (10), the pressure surface (22) extending at least up to the wire outlet opening when the pressing element (19) is in the holding position;
   cutting means (12) movably located on the positioning finger (2) in the vicinity of the wire outlet opening (10) and movable between a rest position clear of the wire opening and a cutting position in front of the wire outlet opening; and
   wherein said pressing element comprises a two-component structure, one component (30) carrying a hold-down pressure surface (25) and the other component carrying a holding surface (22) projecting, when in holding position, by a lesser extent than said hold-down pressure surface (25).

18. Compact combined wire positioning and cut-off tool for, in one operation, positioning a wire (5) and cutting the wire closely adjacent said tool, comprising
   a tool housing (1);
   a positioning finger (2) extending from the housing;
   a wire guide channel or duct (4) formed in the finger and having a wire outlet opening (10);
   a pressing element (19) having a pressure surface (22) movably located adjacent the wire outlet opening (10) for movement transversely to the axial direction of the outlet opening;
   pressing element position control means (21) coupled to the pressing element (19) for positioning the pressing element in a quiescent position removed from the wire outlet opening (10), and a holding position for holding the wire projecting from the wire outlet opening (10), the pressure surface (22) extending at least up to the wire outlet opening when the pressing element (19) is in the holding position;
   cutting means (12) movably located on the positioning finger (2) in the vicinity of the wire outlet opening (10) and movable between a rest position clear of the wire opening and a cutting position in front of the wire outlet opening; and
   wherein the cutting means comprises a blade element terminating in an end portion (18); and
   wherein the positioning finger, in the vicinity of said outlet opening (10), is formed with a knife surface (43) for cutting cooperation with said end portion.

19. The tool of claim 18, wherein said pressure surface (22) of said pressing element (19) has a rib (24) essentially aligned with the wire (5) projecting from the outlet opening (10), and having a width transverse to the direction of said wire projecting from the outlet opening which has a dimension approximately up to the diameter of a conductor (5a) within the wire (5); and
   wherein said rib (24) has a central region on the pressing element (19), extending in longitudinal direction with respect to the wire (5) projecting from the outlet opening (10), said central region having the width of substantially up to the diameter of the conductor (5a) within said wire (5) and two regions of wider width (23, 25), located at end regions of said rib (24), one of said regions being located adjacent an end surface (9) of the finger (2) and adjacent said wire outlet opening (10).

20. The tool of claim 18, wherein said positioning finger (2) has an angled-off portion (43), said wire outlet opening (10) being located at a terminal surface of said angled-off portion, and said cutting means is movably located for movement across said wire outlet opening (10).

* * * * *

UNITED STATES PATENT AND TRADEMARK OFFICE
CERTIFICATE OF CORRECTION

PATENT NO. : 5,442,848
DATED : August 22, 1995
INVENTOR(S) : KOLLER et al.

It is certified that error appears in the above-indentified patent and that said Letters Patent is hereby corrected as shown below:

Title page,     Item [22], insert:

--[30]  Foreign Application Priority Data

Apr. 20, 1993   Fed. Rep. Germany ....P 43 12 770.0--

Signed and Sealed this

Fifth Day of March, 1996

Attest:

BRUCE LEHMAN

*Attesting Officer*     *Commissioner of Patents and Trademarks*